United States Patent [19]

Quick et al.

[11] Patent Number: 5,070,591
[45] Date of Patent: Dec. 10, 1991

[54] METHOD FOR CLAD-COATING REFRACTORY AND TRANSITION METALS AND CERAMIC PARTICLES

[76] Inventors: Nathaniel R. Quick, 44 Center Grove Rd., H15, Randolph, N.J. 07869;
James C. Kenney, 5846 Carvel Ave., Indianapolis, Ind. 46220

[21] Appl. No.: 468,250

[22] Filed: Jan. 22, 1990

[51] Int. Cl.⁵ .......................... B21B 1/46; B22F 1/00
[52] U.S. Cl. ........................ 29/527.4; 75/342; 164/91; 419/2; 419/12; 419/13; 419/14; 419/19; 419/23; 419/28; 419/47
[58] Field of Search ............... 428/570; 29/412, 424, 29/527.6, 527.4; 75/343, 342, 255, 954, 956; 164/461, 69.1, 91, 75; 264/140, 60; 427/234, 431; 419/2, 12, 13, 14, 19, 23, 28, 47

[56] References Cited

U.S. PATENT DOCUMENTS 4,873,148 10/1989 Kemp, Jr. et al. .................. 428/570

*Primary Examiner*—Jan H. Silbaugh
*Assistant Examiner*—Christopher A. Fiorilla
*Attorney, Agent, or Firm*—Clay Holland, Jr.

[57] ABSTRACT

Metal and ceramic particles of various morphologies are clad with a coating from the transition metal group consisting of silver, gold, copper, nickel, iron, cobalt, aluminum etc., or combinations thereof, to provide improved coated particles for microelectronics or metal matrix composites or other uses. Refractory metal precursor core particles, such as tungsten, molybdenum, niobium and zirconium, as examples, are provided from a composite of tungsten and copper, for example, made by pressurizing and infiltrating or liquid phase sintering of molten copper into a porous tungsten skeleton. Precursor chip particles derived from a tungsten impregnated billet are used as starter particles which may be further enhanced by cogrinding in an attritor ball mill with smaller copper particles to thereby produce an enhanced copper clad-coating of tungsten particles with predetermined percent by weight of copper and tungsten content. The resulting particles exhibit improved electrical and thermal expansion coefficient matching properties for use on microelectronic ceramic substrates and when used for metal matrix composition, provides more uniform distribution of the dispersed strengthening particulate phase in the matrix. In another embodiment, ceramic particles are clad-coated with selected metals so that they can be used in ceramic-metal matrices, thereby producing systems wherein the components are uniformily didpersed throughout the system.

25 Claims, 1 Drawing Sheet

METHOD FOR CLAD-COATING REFRACTORY AND TRANSITION METALS AND CERAMIC PARTICLES

FIELD OF THE INVENTION

This invention relates to the field of coated metal and ceramic particles. Coated metal particles are sought as useful with monolayer and multilayer microelectronic circuits utilizing ceramic substrates. Such microelectronic circuits may be formed on ceramic substrates using thick-film pastes and inks filled with coated particles or by direct deposition of certain coated particles. In the field of metal matrix composites metal coated metal and ceramic particles are sought for use in such composites to provide uniform dispersion of metal or ceramic core particle materials throughout the composite systems, wherein the core materials are separated by the coating materials to minimize, if not to avoid core-to-core contact thereby maximizing composite mechanical strengthening and other properties. In addition to the foregoing, ceramic particles coated with metal are sought for abrasive or abradable materials for deposition or coatings on certain aircraft parts, or for use in ceramic-metal composite matrices used for automobile and aircraft parts.

BACKGROUND OF THE INVENTION

Since the recent advent of several exciting new ceramic materials useful for microelectronics, primarily as an insulating medium or support substrate thereof, there has developed an urgent need for the provision of electroconductive materials which are compatible therewith, both as to thermal expansion coefficient and thermal conductivity matching. The new ceramics mentioned are aluminum nitride, silicon carbide and boron nitride, which exhibit properties that are comparable with, and in some instances superior, to alumina and beryllium oxide. Therefore, these new ceramics are currently under intense test and evaluation for military and commercial uses as substitutes for the prior art ceramics used for electronic circuit substrates. In the particular case of aluminum nitride, it is recognized and considered by some authorities in the field of ceramics, as equal to or superior to byrellium oxide as a microelectronic substrate material, see Ceramic Industry, May 1989, pages 25-27.

The need for improved metal clad-coated refractory particles arises from the fact that such particles are thought to possess both good electrical and metallurgical properties and are not readily available in a wide range of desired combinations. This is especially so in particle sizes of less than 10 microns and particles having prescribed percent of coating material by weight to the core of the particle material. Prior art technology techniques for coating of particles are principally by means of chemical vapor deposition or electroless plating and such processes are not readily adaptable to controlled deposition of a wide range of coating materials and for micron size particles. In addition, when such prior art techniques are employed for coating purposes, it is recognized that there are often residual chemical contaminates which are detrimental to thick-film pastes and coatings used for electronic circuits, and radiofrequency and elctromagnetic shielding.

In the case of metal matrix composites utilizing refractory metals, considerable time, research and monies have been expended to provide composites which exhibit improved mechanical properties. In this connection, a well recognized technique known as rapid solidification processing have been used in efforts to provide the improved mechanical properties desired. The resultant amorphous particle contains precipitates which behave as a dispersed second phase. However this metastable structure recrystallizes at high temperatures resulting in the loss of any mechanical strengthening benefits. In addition, the technology is limited to specific compositions that limit the actual metal content of the particles.

In the prior art one notable method for the coating of particles is the carbonyl process, where under certain conditions, carbon monoxide combines with metal to form a volatile metal carbonyl. When the metal carbonyl is heated to temperatures above 200 deg C at atmospheric pressure, the reverse reaction takes place, releasing carbon monoxide and depositing pure metal. When metal carbonyl is fed into a heated bed of fluidized particles, for example tungsten particles, it decomposes depositing metal on the particles. See U.S. Pat. No. 3,342,587, issued Sept. 19, 1967, to C. B. Goodrich, et. al. In theory, the carbonyl process would appear to provide a wide range of opportunities to coating various material particles both metallic and non-metallic.

However, in practice the process has proven to be limited as to the composition of materials and particle sizes, and therefore is not as universal, cost effective and as easy to implement as desired. See Modern Developments in Powder Metallurgy, Volumes 18–21, 1988, Metal Powder Industries Federation, Princeton, N.J. Nickel Coated Powders via the Carbonyl Nickel Gas Process, by E. L. Rees, et. al., Novamet Specialty Products, Corp., Wyckoff, N.J.

Another reason for seeking new techniques for combining refractory metals with traditional electroconductive metals such as copper, nickel, silver, gold or combinations thereof arises from the fact that binary alloys of refractory metals such as tungsten and molybdenum, as examples, are not readily formed and certainly are not cost effective in production of micron size particles. Similarly, ceramic materials are not known to combine readily as alloys with transition or other metals.

Finally, when the refractory metals are used as electroconductive filler for thick-films in microelectronic applications or in certain metal composite systems it is not necessary for the refractory metal core to be heated to the molten phase so long as the coating material reaches the molten or the near molten phase necessary for sintering. Therefore, pastes made with these materials which are screened onto green (unfired) ceramic tape can be made compatible with low temperature (i.e., less than 1000 deg C) cofired tape processes developed by companies such as IBM, DuPont and AT&T.

In the case of ceramic particles, a new and useful metal-to-ceramic composite system may be formed wherein clad-coated material reaches the molten or near molten phase during processing to thereby produce a high ceramic content in the metal-to-ceramic system which has advantages over an all metal system.

BRIEF SUMMARY OF THE INVENTION

In accordance with the present invention, it has been discovered that various metal or ceramic particles can be clad-coated (microcladded) with metals wherein the resulting coated particles may be on the order of 10 microns or less. These micron size clad-coated particles are produced by an unobvious process of compacting particles of core metal or ceramic to the degree of voids desired; heating the compacted particles under preselected pressure in an inert or reactive gas, i.e. hydrogen or forming gas, to remove near surface and surface oxygen and to form a skeleton for receiving a molten clad-coating metal or alloy; rendering a resulting infiltrated skeleton cylinder billet into chip particles to form initial precursor particles; attritor grinding the precursor particles to particles on the order of 10 microns or less; and further enhancing the metal clad-coating of the resulting particles by further attritor grinding such particles with particles of the clad-coating material in an atmosphere of inert or reactive gas at preselected temperatures.

In another embodiment of the invention, the resulting all metal particles are further processed by passing such particles through a thermal/plasma spray system whereby such particles are rendered molten or near molten on exiting the system and are thereupon quenched in liquid, such as water for example, to thereby produce spherical or near spherical particles. Suitable thermal/plasma spray coating systems are available from METCO, a division of Perkin-Elmer, of Waterbury, L.I., N.Y..

Therefore, one object of the invention is to provide both metal and ceramic particles which may be uniformily clad-coated with a variety of metals whose particle size is in the micron range.

Another object of the invention is to provide metal particles which have a spherical or near spherical morphology.

Still another object of the invention is to provide metal particles useful for microelectronic circuit pastes, inks and EMI shielding materials.

Yet another object of the invention is to provide particles useful for dispersion strengthening particle/metal matrix composite systems, wherein the core material of the particles can be uniformily dispersed within the matrix and the core-to-core material contact is minimized, if not eliminated.

Still a further object of the invention is to provide particles useful for refractory metal or ceramic liquid phase sintered composites, wherein the core material of the particles can be uniformily dispersed within the matrix and the core refractory metal or ceramic particles are isolated and protected from stress fracture owing to the intervening clad-coated materials.

BRIEF DESCRIPTION OF DRAWINGS

The clad-coated particles of the invention can be understood in more detail with help of the accompanying drawings wherein:

in FIG. 2b there is depicted a cross-sectional view of the flake shown in FIG. 2a.

DETAIL DESCRIPTION OF THE INVENTION

Figure 1A:
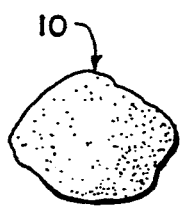
FIG. 1a depicts a core particle clad-coated as a granular morphology, and in FIG. 1b there is depicted a core particle in cross-sectional view illustrating irregular surfaces of the core material.

The clad-coated particles of the present invention may be in the form of a flake morphology or a granular morphology. As shown in FIGS. 2a–2c of the drawings, there is illustrated three views of a micron size particle in the flake morphology, wherein two or more core particles are contained in the flake. In contrast, as illustrated in FIGS. 1a and 1b of the drawings, the micron size granular morphology is depicted, having a single core particle coated by metal.

The core particles of the invention as depicted in the drawings may have irregular exterior surfaces in a jagged configuration as illustrated in the drawings. The jagged surfaces of the various core particles may be more pronounced than others depending upon whether the core material is a metal or ceramic. It is generally understood in the prior art, that ceramic material particles would exhibit a more pronounced jagged surface than metal owing to the brittleness of ceramic and would develop such jagged surfaces when fractured during the process of making particles thereof, in the micron size range, for example.

Figure 2A:
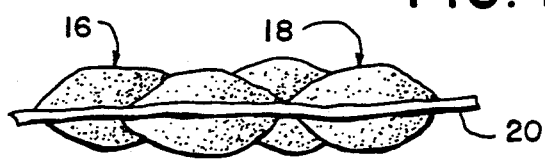
FIG. 2a depicts a particle as a flake wherein several core particles are combined to form such flake morphology.
Figure 1B:
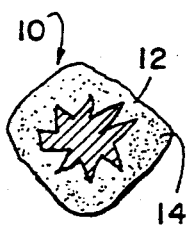
Figure 2B:
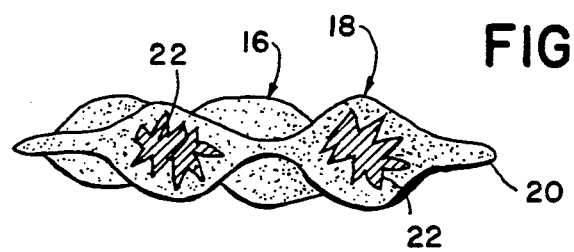
Figure 2C:
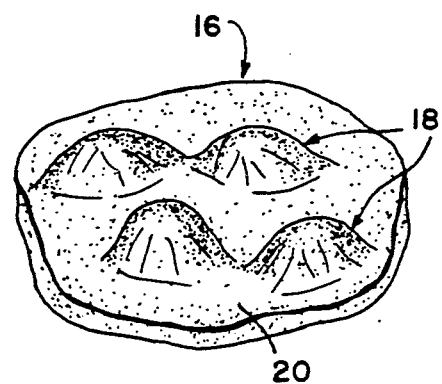
FIG. 2c is a prespective view of the flake morphology.

Referring to the drawings, FIG. 1a, depicts a particle 10 having a granular morphology, while FIG. 1b depicts a cross-sectional view of particle 10, illusttrating a core particle 12 and a clad-coating 14. FIG. 2a depicts a particle 16 having a flake morphology. As shown the flake 16 contains several clad-coated particles 18 coated with a metal clad-coating 20. In FIG. 2b there is shown a cross-sectional view of flake 16, illustrating several core particles 22 and claddant 20; while FIG. 2c depicts a perspective view of flake 16 illustrating the core particles 18 and metal claddant 20.

As noted herein above, the core's surface has been characterized as having an extremely rough (i.e. jagged) surface area; however, it should be understood that the present invention is operable with core particles whose surfaces do not have as pronounced a surface roughness as depicted in the drawings.

The rough/jagged surface areas of the core particles are used to a unique advantage in accordance with the teachings of the present invention. More specifically, the jagged surfaces of core particles advantageously insure that the coating material, which may be characterized as claddants, form an interlocking mechanical bond with the surface of the core particles in large measure owing to the jagged surface configuration. This unique interlocking feature between the claddant material and the core particles, is especially beneficial in the case of ceramics which are known to crack or fracture under high stress conditions. When clad-coated particles of the present invention are used in a composite matrix application the claddant materials act as a crack propogation blunter or a stress concentration buffer to eliminate the occurence of such undesirable cracking or stress concentration within the composite matrix. In doing so, this buffering effect enhances the mechanical properties, in particular ductility, of such composite matrices and enable these clad-coated materials to be utilized in a wide range of applications heretofore unavailable or thought to be unattainable.

In the case of metal coated particles it has been discovered that the bonding mechanism, i.e. adhesion, is both metallurgical and mechanical exhibiting little interdiffusion between the core and coating materials. Physical properties (electrical resistivity, thermal coefficient of expansion, thermal conductivity, modulus of elasticity, ultimate tensile strength etc.) therefore, generally follow the rule of mixtures, i.e., the clad-coated particle effective properties are a function of the volume fraction of each material component. Consequently, when metal coated core particles of this invention are used in a composite matrix they exhibit enhanced mechanical properties than heretofore available in composite matrix applications where non-clad-coated particles are utilized.

When metal core coated particles are used in electroconductive applications such as in thick film pastes, for example, the bond development is adequate to provide excellent electrical and thermal properties for applications heretofore unavailable. The present invention enables an unlimited combination of metals to be produced to accommodate uses and applications heretofore considered impractical or unattainable.

The unique process for producing novel micron size metal clad-coated particles as flake or granules, in accordance with the present invention, is commenced by forming a skeletal structure, which may be a cylindrical or rectangular bar of compacted core material, such as metallic tungsten or ceramic tungsten carbide particles, as examples. Particles of tungsten or tungsten carbide may be on the order of or less than 20 microns, and are placed in a mold and compacted to a preselected density such that the percent of particles to available voids is known. For example, the particles may be compacted so that the resulting skeleton or sponge-like billet formed will have from 10% to 95% core particles with a corresponding 95% to 10% voids, respectively therein, after the particles are heated to a prescribed elevated temperature and pressure required for the formation of a rigid porous sponge like structure. The sponge-like structure formed is next infiltrated with a molten claddant of transition metal such as copper, silver, gold, nickel as examples, wherein the porous voids within the sponge-like structure are filled, See Metals Handbook, 9th edition, Vol. 7, ASM, (1984). After cooling and solidification of the claddant metal the impregnated billet is reduced to fine chips by conventional maching techniques such as milling using noncontaminating tool bits. These chips are further processed by grinding in an appropriate attritor ball mill such as that available from Union Process, Akron, OH., or a horizontal bead mill such as that available from Premier Mill, Reading, PA., to produce fine granular or flake particle morphologies on the order of 10 microns or less.

The morphology of the particles may be granular or flake depending upon the material being processed and time selected for the milling process and whether the milling process is conducted dry or with a liquid media, such as distilled water or other solvents, both under inert or partially reducing atmospheres.

The present invention is adaptable to a wide range of refractory metals as core materials such as tungsten, molybdenum, and niobium etc., as examples, as well as transition metals such as titanium and nickel, as examples. In general, the material selected as the claddant will be softer and have a lower melting temperature than the core material it will coat as one method to limit interdiffusion; another conventional method to limit interdiffusion is the control of thermal heating/cooling rates and soak times at temperature. The claddant and core materials can be immiscible.

One advantage for using a softer material as the claddant arises from the fact that the softer material in a two part arrangement tends to be smeared over the entire surface area of the core particles during the attritor milling process.

In another embodiment of the invention, it may be desirable to add fine particles of the claddant material during attritor milling of the clad-coated core particles so that cogrinding occurs. The cogrinding step may be used for the purposes of insuring complete coverage of the core particle by the claddant and/or to produce a thicker coating of the claddant on the core particle. Thus, the cogrinding embodiment of the invention provides an additional means for determining and controlling the percent of each material in the resulting particles.

Although the final particle sizes noted herein above, are less than 20 microns, it should be recognized that particle sizes less than 1 micron (i.e. submicron) are attainable. The limitation of particles less than 1 micron may be constrained by the ability to have one micron or less particles of core materials to produce the sponge-like skeleton and by the suitablity of cost effective milling devices for production quantities. Small sample quantities have been produced and examined and were in conformity with the teachings disclosed herein.

Further, disclosure of the present invention is made with reference to several examples:

EXAMPLE I

Tungsten is prone to form troublesome oxide films which require high pressures and amperage to fracture. In electrical contact applications it is found that in silver-tungsten mixtures that the higher the silver concentration, the more oxide resistant is the tungsten. This oxide resistance would be further improved with the use of gold. Therefore, the purpose of the microcladding of tungsten with gold and silver is to produce an oxide free tungsten particle inert to environmental oxidation. This material would represent a cost reduction over the Au, Ag, Pd-Ag, Pd-Au, and Au-Pt currently used in thick film conductors.

The following material mixtures were selected for processing:

| Material | Resisitivity ($10^{-6}$ ohm-cm) |
| --- | --- |
| Tungsten-65 wt % Silver (W—Ag) | 3.6 |
| Tungsten-68 wt % Gold (W—Au) | 4.6 |
| Tungsten-70 wt % Copper (W—Cu) | 3.7 |

The W-Ag, W-Au and W-Cu were clad-coated for electrical conductor powder applications. Through a rule of mixtures computation using volume fractions, the above compositions were designed to obtain the above conductivities. The microcladding design program based on the rules of mixtures volume fraction equations is computerized which allows rapid determination of necessary volume fractions for customization of electrical resistivity, thermal expansion coefficient and thermal conductivity.

All particle sizes for infiltration were on the order of 4 micron. Particle sizes for powders added during attritor cogrinding were on the order of 10 micron and had a flake morphology.

In the general processing sequence a tungsten bar is first cold pressed under pressure to obtain a density 10–93% of theoretical density (19.3 gm/cc). Loosely compacted powder (i.e. no pressure) would have a density of 10% theoretical. Some powder of the microcladdant can also be added during pressing to customize tungsten density.

The resultant bar is then lightly sintered to remove any binder and oxide at a temperature not exceeding 1300 deg C to prevent shrinkage. The bars are stoked through a furnace containing reducing or inert atmospheres or mixtures of the two (i.e., hydrogen+nitrogen).

The surface of the bar excluding the ends are painted with a kaolin or alumina paint to prevent diffusion of the infiltrant from the bulk of the bar to these surfaces.

The infiltrant (micurcladdant) in the form of powder, shot, chips, pellets etc. is placed in pockets at both ends of the bar. These pockets can be made from removed sand or formed graphite boats etc. The furnace condition are those disclosed above, in this case the temperature is 1300 deg C. For low tungsten densities (10%) free tungsten powder is placed in a graphite boat and the microcladdant powder placed on top. A graphite boat lid can be used to supply very light pressure.

The finished bar is chipped by various machining approaches (milling, drilling etc.) or by pulverizer using carbide and other noncontaminating bits. The chips are then rinsed in menthanol.

The chips are then wet-attritor milled under forming gas (4% H2 Bal N2) at 400 RPM in methanol or water or other suitable liquid dispersant which is noncontaminating. Processing time (1-5 hr) and attritor ball media size ($\frac{3}{8}$ to $\frac{1}{4}$ in. diameter 1% Chromium) is adjusted for final particle size. Alternately, a horizontal bead mill (0.8-2.4 mm zirconium silicate bead size) can be used for more rapid and finer submicron grinding. An addition of the microcladdant (particle size 10 micron or less, flake morphology) is added during the last 0.5 hr. to insure complete coverage of the tungsten, refractory metal or ceramic core particle.

Electrical resistivity was measured using an HP 3478A multimeter in the 4 wire resistance mode. Gold probes were used. Powder was compressed in a specially designed cavity for conductivity measurements. Probe tips were spaced 1 cm apart and generally 10 gm or greater of material was used for testing. Mean particle size, particle size distribution and particle size area was measured using an LN Microtrac II.A Cambridge 90B SEM was used for microscopic evaluation.

Mean particle size ranges less than 100 micron were achieved by this technique. As was typically observed, in this case for a 9 micron silver microclad tungsten particle, the microclad particle was a flake morpholgy of the microlcaddant containing several (i.e. 5) tungsten particles. The core tungsten particles appeared as granular structures protruding through both flat surfaces of the flake but completely coated. Minimum coating thickness for clad-coated core tungsten particles is on the order of 0.01 micron to 0.1 microns.

For the infiltrated bars and powder of these microclad compositions, the measured resistivities were within 10% or less of the theoretical values.

Initially the Cu/W and Ag/W should find application in commercial products while the Au/W should be directed towards military products.

The increased densification of power circuits, switching circuits and active device circuits onto smaller electronic substrate areas; the need for bilayer and multilayer electronic substrates that contain one or more metal layer to function as 1) a rapid thermal conductor, and 2) an electrical conductor for power/ground planes and filters; and the toxicity of beryllia and limitations on the thermal properties of alumina (the major commercial substrate now in use) have driven development of alternate electronic substrate materials. Monolithic candidates include AlN, BN, SiC and bilayer and multilayer systems of these and ceramics and $Al_2O_3$ with metals including copper, molybdenum and tungsten. Copper, silver and gold, given their high thermal conductivity are the perferred metals; however, their thermal coefficient of expansions are on average greater than twice that of the above ceramics resulting in thermal mismatch strains.

On heating, cooling and thermal cycling, this mismatch can result in layer debonding, and stress cracking in the ceramic materials. The clad-coat technology of the present invention allows the mixing of the perferred metals with lower thermal coefficient metals such as tungsten and molybdenum so that the thermal coefficient of expansion of metal layers can now be tailored to match the thermal coefficient of expansion of the ceramic materials. For example, the thermal coefficient of expansion of 68% by volume gold-balance tungsten (7.7 ppm/deg C) is designed to matche that of 96% alumina (6.3-9.1 ppm/deg C).

These microclad powders can be used as a bonding layer, i.e. braze, between substrates designed to minimize or eliminate thermal coefficient of expansion mismatch strains and/or as a rapid thermal conductor and electrical conductor in the fabrication of bilayer and multilayer electronic substrates.

EXAMPLE II

A nickel clad tungsten carbide ceramic powder, effectively, tungsten carbide −27 wt % nickel) is producable for abrasives applications. The tungsten carbide is compressed and lightly sintered as discussed in Example I. In melting infiltrants such as Ni and NiCr, the temperature is raised 50 deg above their melting point (i.e. 1450-1500 deg C). The material is then ground to powder as described in Example I. Silicon carbide and other ceramics can also been sintered and infiltrated in this manner.

EXAMPLE III

To illustrate the versatility of the present inventions, prior to coating tungsten particles with silver, gold and germanium were added to silver in preselected quantities. A 45 wt % Ag-38 wt % Au-17 wt % Ge powder composition, having a melting temperature of 525 deg C, was made by first induction melting rods or powders of the compositional materials; fragmentation of the resultant ingot followed by attritor grinding to produce a powder. The purpose of adding the germanium was to control the alloy's melting temperature so that tungsten particles clad with this alloy would sinter at temperatures compatible with low temperature cofired tape processes used in multilayer ceramic electronic substrate fabrication.

A second advantage in adding geramnium is to reduce the electromigration of silver ions. It is known that silver ions will migrate from silver surfaces towards cathodes when silver particles are used at elevated temperatures and high humidity. Such migration can cause electrical shorting in circuit paths made from thick film pastes or inks containing silver. It has been discovered that an additive material, such as germanium or other appropriate semiconductor or semimetal which has a smaller atomic radii than silver is strongly attracted to the silver ions and thus it is assumed to suppress electromigration of silver. Consequently, when combined with other materials, it is possible in accordance with the present invention to tailor the claddant materials so that they have a wide range of mechanical and/or electrical properties to thereby enhance their uses as claddants in an even wider range of applications heretofore thought unattainable.

Binary systems such as silver-germanium (germanium not exceeding 19 wt %) are a simpler example of this technology.

EXAMPLE IV

A 70 wt % Ni- 30 wt % Fe powder is made by first induction melting rods or powders of the compositional materials, fragmentation of the resultant ingot followed by attritor grinding to produce a powder. The powder is then mechanically mixed or mechanically alloyed with tungsten powder, using the attritor, and the mixtured is liquid phase sintered between 1450 to 1600 deg C. The material was then ground to powder as described in Example I. The final composition was 93 wt % tungsten (core) and 5% Nickel, 2% Iron.

EXAMPLE V

In one case, metal matrix composites rely in part on mechanical strengthening by dispersion strenghtening imparted uniformily distributed particulate second phase. Empirical results, (see Ref. S.M.L. Sastry, T.C. Peng, and J. E. O'Neal, "Dispersion Strengthening of Titanium Alloys," AFWAL-ML Contract No. F33615-81-C-5011, Final Report issued 1983 and P. G. Shewmon, Transformation in Metals, (McGraw-Hill: N.Y.) 1969.) suggest that the dispersed particles be on the order or less than 1 micron and the matrix spacing between these particles be on the order of a micron or less. At the other extreme for conventional composite strengthening through the rule of mixtures, these dimensions should be greater than 1 micron. Titanium diboride is a second phase particle that was evaluated for titanium alloy systems.

Titanium diboride powder (HCT-S supplied by Union Carbide Advanced Ceramics, Cleveland, Ohio) was refined to a mean particle size of 4 microns by attritor ball milling. The titanium diboride powder is then sintered in an argon atmosphere in the range of 2050 deg C to a density of 50 wt % as discussed in Example I. The skeleton is then infiltrated with titanium-6 wt % aluminium-4 wt % vanadium in the temperature range 1670–1700 deg C under argon. The material is then reduced to powder per the steps in Example I. with the use of an argon atmosphere in all reduction steps. The resultant flake powder is then thermal sprayed through a Metco Plasma Spray System or other plasma/thermal spray systems and collected on a chill plate or in a quenching media such as distilled water. The powder is spherical or near spherical in shape.

As can readily be seen from disclosure and teaching herein, the present invention provides a new, useful and unobvious method and micron size particles, which have a variety of morphologies, electrical, thermal, mechanical or chemical properties or combinations thereof which were heretofore considered unattainable in the prior art.

More particularly, the clad-coating (microcladding) of particles is a branch of microcompositing where a descrete particle is coated by a different material with the intent of taking advantage of select properties of both material species. This is different from alloying where mixing is on the atomic scale resulting in a new material having its own intrinsic properties. The compositing or mixing of different materials is, therefore, accomplished on the micro-scale thus allowing a wider scope of materials mixing; physical properties can be adjusted by the rule of mixtures law resulting in more uniform property distribution in the macro-composites produced from these clad-coated particles. The resultant structure can be pictured as a core particle encapsulated with a different material. These coated particles can themselves be descrete or agglomerated in clusters where the core particles are not in intimate contact.

Accordingly, the following properties can be fine tuned to heretofore unexpected results in these powders;

1. Electrical
   a. Electroconductivity (resistivity), which can be tailored.
2. Thermal
   a. Thermal coefficient of expansion;
   b. Thermal conductivity; and
   c. Transition temperatures, which can be tailored.
3. Chemical
   a. Electromigration;
   b. Corrosion resistant by surface coating; and
   c. Adhesion, which can all be contolled.
4. Mechanical
   a. Density;
   b. Ultimate Tensile Strength/Hardness;
   c. Reduction of crack initiation sites (prevention of core particle to core particle contact);
   d. Increased ductility (crack propogation blunting); and
   e. Dispersoid distribution uniformity (Metal matrix composites), all of which can be obtained utilizing the methods of the present invention.

In closing, it is to be understood that the above embodiments are only illustrative of the principals applicable to the invention. Various other material modifications and adaptations may be defined by those skilled in the art when exposed to the disclosure and teachings herein, without departing from the spirit and scope of the invention. For example, if it is desirable to have additional core particles embedded on the outer surface of the resulting particles, cogrinding with additional core particle material instead of clad-coating material would accomplish such an end result. Although the particles have been disclosed in granules and flakes it is understood that other morphologies are applicable such as platelets and whiskers.

What is claimed is:

1. An improved method of making micron size particles clad-coated with metal, said improvement comprising the steps of:
   a. forming a sponge-like skeletal body of consolidated-core metal particles, to thereby form voids within said body;
   b. infiltrating said voids of said skeletal body with a molten metal or metal alloys by means of pressure and liquid phase sintering or pressure and infiltration, to thereby form a billet of consolidated particles impregnated with said metal or metal alloy;
   c. reducing said billet to fine chips by machine turning or milling; and
   d. further reducing said fine chips to micron size particles by means of attritor, ball or horizontal bead milling.

2. Method of claim 1 in which said voids may be varied to a preselected percent of the total volume of said skeletal body between 10 to 95 wt %.

3. Method of claim 2 in which said core metal particles are refractory metal.

4. Method of claim 3 in which said refractory metal is selected from the group consisting of tungsten, molybdenum, niobium, zirconium, and hafnium.

5. Method of claim 1 in which said core metal particles are a transition metal.

6. Method of claim 2 in which said molten transition metal is selected from the group including gold, silver, copper, nickel, titanium, iron, aluminum and vanadium.

7. Method of claim 6 in which said molten metal is an alloy of at least two metals from said group.

8. Method of claim 1 which includes the further steps of:
   a. passing said micron size particles through a thermal or plasma spray device to thereby form molten surfaces on said particles as said particles exit said plasma spray device; and
   b. directing said molten exiting particles into a quenching media, to thereby form spherical-like particles.

9. Method of claim 8 in which said quenching media is uncontaminated water.

10. Method of claim 4 in which said molten metal in combination with core particles determines an electrical resistivity property of said micron size particles.

11. Method of claim 4 in which said molten metal in combination with said core particles determines a thermal coefficient of expansion of said micron size particles.

12. Method of claim 4 in which said molten metal in combination with core particles determines a mechanical property of said micron size particles.

13. Method of claim 4 in which said molten metal in combination with said core particles determines the environmental chemical properties of said micronparticles.

14. Method of claim 4 in which said molten metal in combination with said core particles determines the morphology of said micron particles.

15. Method of claim 4 in which said morphology of said micron size particles is flake or granual.

16. Method of claim 1 in which said core particles may be between 50 microns to 0.5 micron.

17. Method of claim 1 in which said micron size particles are less than 50 microns.

18. Method of claim 5 in which said transition metal are selected from the group consisting of copper, nickel, silver, gold, titanium, aluminum, iron and vanadium, and alloys thereof.

19. Method of claim 1 which includes a further step of further milling of said micron size particles by means of cogrinding said micron size particles with particles of said metal or metal alloy.

20. Method of claim 1 in which said step for forming said sponge-like skeletal body of consolidated-particles including the addition of a binder, to thereby assist in the formation of said body of consolidated-particles.

21. Method of claim 20 which includes a further step of heating said sponge-like skeletal body after initial formation to a temperature in inert or forming gas to purge said skeletal body of said binder prior to infiltration thereof with molten metal or metal alloy.

22. Method of claim 7 in which said alloy includes a semimetal or semiconductor.

23. Method of claim 22 in which said semiconductor is germanium, silicon or carbon.

24. Method of claim 4 in which said molten metal in combination with core particles determines the thermal conductivity of said micron size particles.

25. Method of claim 4 in which said molten metal in combination with core particles determine the sintering temperature of said micron size particle.

* * * * *